United States Patent
Watanabe et al.

(10) Patent No.: US 10,110,176 B2
(45) Date of Patent: Oct. 23, 2018

(54) AMPLIFIER

(71) Applicant: Murata Manufacturing Co., Ltd., Kyoto (JP)

(72) Inventors: Daisuke Watanabe, Kyoto (JP); Ken Wakaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/586,741

(22) Filed: May 4, 2017

(65) Prior Publication Data

US 2017/0366145 A1    Dec. 21, 2017

(30) Foreign Application Priority Data

Jun. 17, 2016  (JP) .................................. 2016-120721

(51) Int. Cl.
  *H03F 1/56* (2006.01)
  *H03F 1/02* (2006.01)
  *H03F 3/193* (2006.01)

(52) U.S. Cl.
  CPC ........... *H03F 1/565* (2013.01); *H03F 1/0205* (2013.01); *H03F 3/193* (2013.01); *H03F 2200/222* (2013.01); *H03F 2200/294* (2013.01); *H03F 2200/387* (2013.01)

(58) Field of Classification Search
  USPC ................................. 330/302, 305, 192, 185
  See application file for complete search history.

(56) References Cited

U.S. PATENT DOCUMENTS

| 7,671,693 | B2* | 3/2010 | Brobston ................. H03H 7/40 333/17.3 |
| 7,764,125 | B2* | 7/2010 | Dawe ....................... H03F 1/56 330/302 |
| 8,963,644 | B2* | 2/2015 | Ma ......................... H03F 1/0277 330/302 |
| 2007/0115086 | A1 | 5/2007 | Cairo Molins | |
| 2011/0294452 | A1 | 12/2011 | Kawai | |

FOREIGN PATENT DOCUMENTS

| JP | 2006-325163 A | 11/2006 |
| JP | 2007-142418 A | 6/2007 |
| JP | 2008-118321 A | 5/2008 |
| JP | 2011-250099 A | 12/2011 |

\* cited by examiner

*Primary Examiner* — Hieu Nguyen
(74) *Attorney, Agent, or Firm* — Pearne & Gordon LLP

(57) ABSTRACT

An amplifier according to an embodiment of the present disclosure includes a first transistor and a first matching circuit. The first matching circuit is connected between an input terminal and a control terminal of the first transistor. The first matching circuit includes a first inductor, a second inductor, and a first switch. The first inductor has an end connected to the control terminal. The second inductor has an end connected to the other end of the first inductor. The first switch is configured to selectively switch between electrical continuity between the input terminal and the other end of the first inductor and electrical continuity between the input terminal and the other end of the second inductor.

8 Claims, 13 Drawing Sheets

AMPLIFIER

This application claims priority from Japanese Patent Application No. 2016-120721 filed on Jun. 17, 2016. The content of this application is incorporated herein by reference in its entirety.

BACKGROUND

The present disclosure relates to an amplifier that amplifies a high-frequency signal. In the related art, it is known that it is necessary to match the input impedance of an amplifier to a characteristic impedance (of, for example, about 50Ω) to prevent the reflection of an input signal. For example, Japanese Unexamined Patent Application Publication No. 2011-250099 discloses an antenna amplifier device that is provided with a noise figure (NF) matching circuit between an antenna having a capacitive impedance and an amplifier circuit to switch the input impedance to the amplifier circuit in accordance with the receive frequency. The NF matching circuit includes a plurality of coils having different inductances, and a switch for connecting one of the coils that is selected in accordance with the receive frequency between the antenna and the amplifier circuit. Since the NF matching circuit allows the input impedance to the amplifier circuit to be switched in accordance with the receive frequency, a high-frequency signal received by the antenna is amplified with low NF by the amplifier circuit even when an input signal is weak.

In the NF matching circuit disclosed in Japanese Unexamined Patent Application Publication No. 2011-250099, one of the pluralities of coils (inductors) having different inductances is selected in accordance with the frequency of an input signal to increase the bandwidth of the matching circuit. In this case, the inductance necessary for the matching of the input impedance is known to increase as the frequency of the input signal decreases. In the NF matching circuit disclosed in Japanese Unexamined Patent Application Publication No. 2011-250099, the inductors other than the selected inductor are not used for the matching of the input impedance and thus the necessary inductance needs to be implemented with a single inductor. In order to increase the inductance of an inductor, it is typically necessary to increase the number of turns in the inductor. Since there is a limitation in the volume that can be used to form an inductor, it is necessary to reduce the width of a wire that is used to form the inductor to increase the number of turns in order to realize the inductance necessary for the matching of the input impedance while maintaining the element size. The narrower a wire used to form an inductor, the greater the resistance component of the inductor, resulting in increased insertion loss. Thus, in the antenna amplifier device disclosed in Japanese Unexamined Patent Application Publication No. 2011-250099, an increase in the inductance of an inductor selectable in the NF matching circuit to implement an input matching circuit with a wide bandwidth results in an increase in the resistance component of the inductor if there is a constraint on the element size. This can increase the insertion loss of the antenna amplifier device and increase the noise figure, which is a characteristic important for an amplifier. As a result, it may be difficult to implement an input matching circuit with a wide bandwidth and reduced deterioration of the noise figure of the antenna amplifier device.

BRIEF SUMMARY

Accordingly, the present disclosure implements input and output matching circuits with a wide bandwidth and reduced deterioration in noise figure.

According to embodiments of the present disclosure, an amplifier amplifies a signal input from an input terminal thereof and outputs the amplified signal from an output terminal thereof. The amplifier includes a first transistor and a first matching circuit. The first transistor includes a control terminal, a first terminal, and a second terminal. The first matching circuit is connected between the input terminal and the control terminal of the first transistor. The first terminal of the first transistor is connected to a ground point. The second terminal of the first transistor is connected to a power supply and the output terminal. The first matching circuit includes a first inductor, a second inductor, and a first switch. The first inductor has a first end and a second end. The first end of the first inductor is connected to the control terminal of the first transistor. The second inductor has a first end and a second end. The first end of the second inductor is connected to the second end of the first inductor. The first switch is configured to selectively switch between electrical continuity between the input terminal and the second end of the first inductor and electrical continuity between the input terminal and the second end of the second inductor.

In an amplifier according to embodiments of the present disclosure, selective switching between electrical continuity between the input terminal and the second end of the first inductor and electrical continuity between the input terminal and the second end of the second inductor enables the impedance necessary for the matching of the input impedance to be realized by a plurality of inductors connected in series. Thus, a wire (line) used to form an inductor can be thicker than that in the related art. In consequence, since the resistance component of the inductor does not increase, it is possible to implement an input matching circuit with a wide bandwidth and reduced deterioration in noise figure.

Other features, elements, characteristics and advantages of the present disclosure will become more apparent from the following detailed description of embodiments of the present disclosure with reference to the attached drawings.

DETAILED DESCRIPTION

Figure 1:
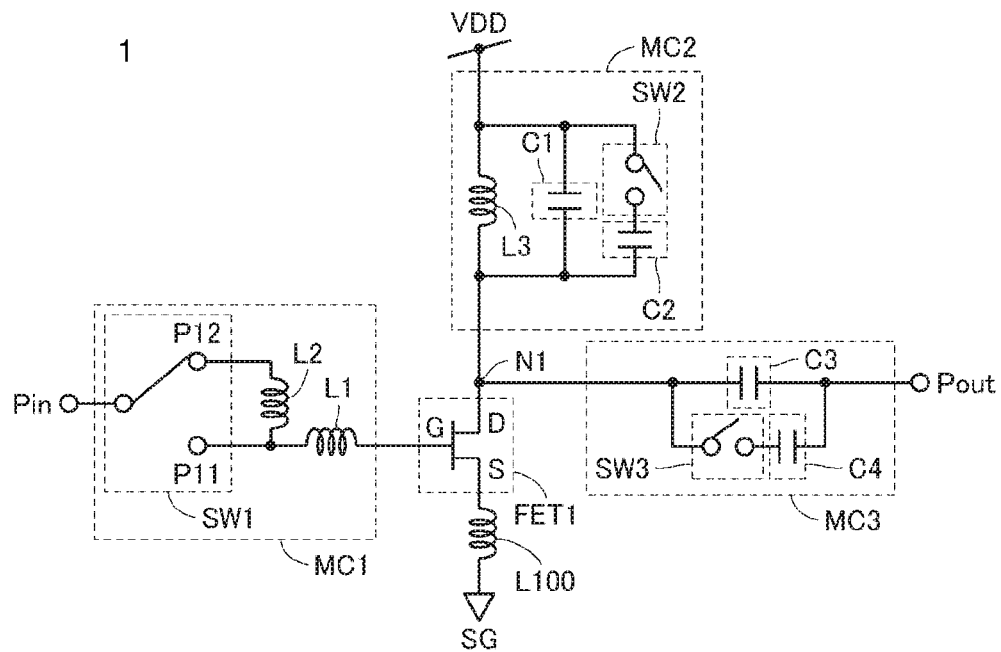
FIG. 1 is an exemplary circuit diagram of a low-noise amplifier according to an embodiment.

An embodiment of the present disclosure will be described in detail hereinafter with reference to the drawings. In the drawings, the same or similar portions are assigned the same numerals and are not basically described repeatedly.

FIG. 1 is an exemplary circuit diagram of a low-noise amplifier 1 according to an embodiment. As illustrated in FIG. 1, the low-noise amplifier 1 amplifies a signal input from an input terminal Pin and outputs the amplified signal from an output terminal Pout. The low-noise amplifier 1 includes a first transistor FET1, a first matching circuit MC1, a second matching circuit MC2, and a third matching circuit MC3.

The first transistor FET1 is a field effect transistor (FET). The first transistor FET1 includes a gate (G) that is a control terminal, a source (S) that is a first terminal, and a drain (D) that is a second terminal. The first matching circuit MC1 is connected between the input terminal Pin and the gate of the first transistor FET1. The source of the first transistor FET1 is connected to signal ground SG, which is a ground point, via an inductor L100. The drain of the first transistor FET1 is connected to a power supply VDD via the second matching circuit MC2 and is also connected to the output terminal Pout via the third matching circuit MC3. A bias adjustment circuit (not illustrated) is connected to the gate of the first transistor FET1.

The first matching circuit MC1 includes a first inductor L1, a second inductor L2, and a first switch SW1. One end of the first inductor L1 is connected to the gate of the first transistor FET1. One end of the second inductor L2 is connected to the other end of the first inductor L1. The first switch SW1 is configured to selectively switch between electrical continuity between the input terminal Pin and the other end of the first inductor L1 and electrical continuity between the input terminal Pin and the other end of the second inductor L2.

The second matching circuit MC2 is connected between the power supply VDD and the drain of the first transistor FET1. The second matching circuit MC2 includes a third inductor L3, a first capacitor C1, a second capacitor C2, and a second switch SW2. The third inductor L3 is connected between the power supply VDD and the drain of the first transistor FET1. The first capacitor C1 is connected in parallel with the third inductor L3. The second switch SW2 is connected in series with the second capacitor C2. The second capacitor C2 and the second switch SW2, which are connected in series, are connected in parallel with the first capacitor C1. In the second matching circuit MC2, switching between the closed and open states of the second switch SW2 allows the effective inductance of the second matching circuit MC2 to be changed in two stages.

The third matching circuit MC3 is connected between the output terminal Pout and a node N1 on a wiring line between the drain of the first transistor FET1 and the second matching circuit MC2. The third matching circuit MC3 includes a third capacitor C3, a fourth capacitor C4, and a third switch SW3. The third capacitor C3 is connected between the node N1 and the output terminal Pout. The third switch SW3 is connected in series with the fourth capacitor C4. The fourth capacitor C4 and the third switch SW3, which are connected in series, are connected in parallel with the third capacitor C3. In the third matching circuit MC3, switching between the closed and open states of the third switch SW3 allows the effective capacitance to be changed in two stages.

Figure 2:
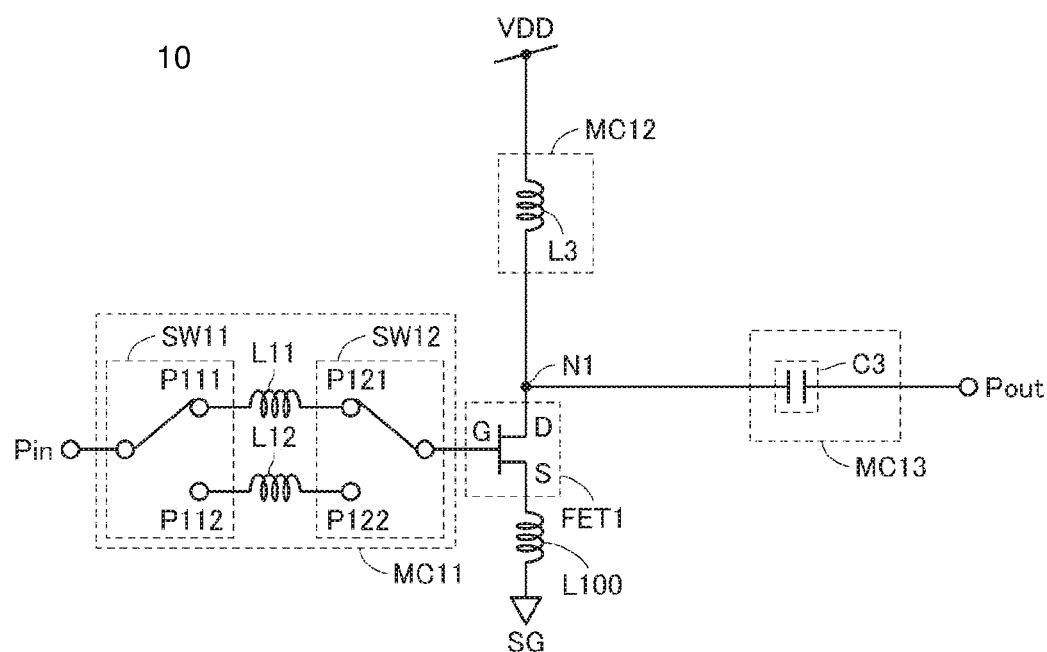
FIG. 2 is an exemplary circuit diagram of a low-noise amplifier according to a comparative example.

FIG. 2 is an exemplary circuit diagram of a low-noise amplifier 10 according to a comparative example. The difference between the low-noise amplifier 10 and the low-noise amplifier 1 is the configuration of a first matching circuit, a second matching circuit, and a third matching circuit. Other configurations are similar and are not described repeatedly.

As illustrated in FIG. 2, the low-noise amplifier 10 includes a first matching circuit MC11, a second matching circuit MC12, and a third matching circuit MC13 in place of the first matching circuit MC1, the second matching circuit MC2, and the third matching circuit MC3 of the low-noise amplifier 1 illustrated in FIG. 1, respectively.

The first matching circuit MC11 includes an inductor L11, an inductor L12, a switch SW11, and a switch SW12. The inductors L11 and L12 have different inductances. The switch SW11 is configured to selectively switch between electrical continuity between the input terminal Pin and one end of the inductor L11 and electrical continuity between the input terminal Pin and one end of the inductor L12. The switch SW12 is configured to selectively switch between electrical continuity between the gate of the first transistor FET1 and the other end of the inductor L11 and electrical continuity between the gate of the first transistor FET1 and the other end of the inductor L12. The switches SW11 and SW12 operate synchronously so that one of the inductors L11 and L12 is connected between the input terminal Pin and the first transistor FET1. Specifically, when the switch SW11 establishes electrical continuity between the input terminal Pin and the one end of the inductor L11, the switch SW12 establishes electrical continuity between the gate of the first transistor FET1 and the other end of the inductor L11. When the switch SW11 establishes electrical continuity between the input terminal Pin and the one end of the inductor L12, the switch SW12 establishes electrical continuity between the gate of the first transistor FET1 and the other end of the inductor L12.

The second matching circuit MC12 includes the third inductor L3. The second matching circuit MC12 includes none of the first capacitor C1, the second capacitor C2, and the second switch SW2, which are included in the second matching circuit MC2 of the low-noise amplifier 1 illustrated in FIG. 1. Unlike the second matching circuit MC2 of the low-noise amplifier 1 illustrated in FIG. 1, the second matching circuit MC12 does not allow the effective inductance to be changed.

The third matching circuit MC13 includes the third capacitor C3. The third matching circuit MC13 includes none of the third switch SW3 and the fourth capacitor C4, which are included in the third matching circuit MC3 of the low-noise amplifier 1. Unlike the third matching circuit MC3 of the low-noise amplifier 1 illustrated in FIG. 1, the third matching circuit MC13 does not allow the effective capacitance to be changed.

In the comparative example, one of the inductors L11 and L12 having different inductances which corresponds to the frequency of the input signal is selected to increase the bandwidth of the first matching circuit MC11. The inductance necessary for the matching of the input impedance is known to increase as the frequency of an input signal decreases. In the first matching circuit MC11, the inductor other than the selected inductor is not used for the matching of the input impedance and thus the necessary inductance needs to be implemented with a single inductor. In order to increase the inductance, it is necessary to increase the number of turns in the inductor. In order to implement the inductance necessary for the matching of the input impedance while maintaining the element size, it is necessary to reduce the width of a wire (line) used to form an inductor to increase the number of turns since there is a limitation in the volume that can be used to form an inductor. The narrower a wire (line) used to form an inductor, the greater the resistance component of the inductor, resulting in increased insertion loss. In the comparative example, therefore, an increase in the inductance of a selectable inductor to implement the first matching circuit MC11 with a wide bandwidth results in an increase in the resistance component of the inductor if there is a constraint on the element size. The increase in resistance component can increase the insertion loss and increase the noise figure, which is a characteristic important for a low-noise amplifier. In the configuration in the comparative example, therefore, it may be difficult to implement an input matching circuit with a wide bandwidth and reduced deterioration of the noise figure of the low-noise amplifier 10.

Accordingly, in an embodiment, selective switching between the electrical continuity between the input terminal Pin and the other end of the first inductor L1 and the electrical continuity between the input terminal Pin and the other end of the second inductor L2 enables the impedance necessary for the matching of the input impedance to be realized by a plurality of inductors connected in series, namely, the first inductor L1 and the second inductor L2. With this configuration, the first inductor L1 can be shared in impedance matchings. Thus, a wire (line) used to form an inductor can be thicker than that in the comparative example, and insertion loss can be eliminated or reduced. It is therefore possible to implement an input matching circuit with a wide bandwidth and reduced deterioration in noise figure.

For example, consideration is given to a case where an input signal has two expected frequencies and inductances of 27 nH and 37 nH are necessary for the matching of the input impedance at the respective frequencies. In the comparative example, one of the inductors L11 and L12 needs to have an inductance of 27 nH and the other inductor needs to have an inductance of 37 nH. That is, in the comparative example, one inductor having an inductance of 27 nH and one inductor having an inductance of 37 nH are necessary.

In the embodiment, in contrast, for example, the first inductor L1 can have an inductance of 27 nH and the second inductor L2 can have an inductance of 10 nH. When an inductance of 27 nH is necessary for the matching of the input impedance, the input terminal Pin and a terminal P11 of the first switch SW1 are brought into electrical continuity to connect only the 27-nH first inductor L1 between the input terminal Pin and the first transistor FET1 to thereby achieve an inductance of 27 nH. When an inductance of 37 nH is necessary for the matching of the input impedance, the input terminal Pin and a terminal P12 of the first switch SW1 are brought into electrical continuity to connect the 27-nH first inductor L1 and the 10-nH second inductor L2 in series between the input terminal Pin and the first transistor FET1 to thereby achieve an inductance of 37 nH. That is, in the embodiment, the 27-nH first inductor L1 is shared between the cases where an inductance of 27 nH is necessary for the matching of the input impedance and where an inductance of 37 nH is necessary for the matching of the input impedance.

Compared with the comparative example that requires a 27-nH inductor and a 37-nH inductor for the matching of the input impedance, in the embodiment that only requires a 27-nH inductor and a 10-nH inductor for the matching of the input impedance, a wire (line) used to form an inductor can be thicker. In this case, in the embodiment, the resistance components of the inductors can be reduced, compared with the comparative example. In the embodiment, therefore, insertion loss can be reduced by an amount corresponding to the reduction in resistance, and deterioration in noise figure can be reduced.

In the following, the matching of the input impedance (the impedance of the gate of the first transistor FET1, as viewed from the input terminal Pin) by using the first matching circuit MC1 and the matching of the output impedance by using the second matching circuit MC2 and the third matching circuit MC3 in the embodiment will be described with reference to FIGS. 3A to 7B. First, a basic explanation about impedance matching will be provided with reference to FIGS. 3A to 3C. Then, the matching of the input impedance by using the first matching circuit MC1 will be described with reference to FIGS. 4A to 5B. Further, the matching of the output impedance (the impedance of the drain of the first transistor FET1, as viewed from the output terminal Pout) by using the second matching circuit MC2 and the third matching circuit MC3 will be described with reference to FIGS. 6A to 7B.

Figure 3A:
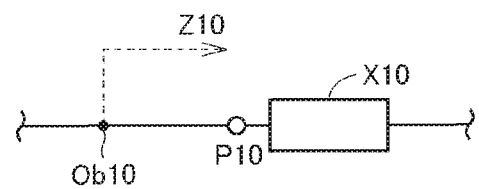
FIGS. 3A to 3C are diagrams depicting a change in impedance when an inductor is connected in series with a circuit element for impedance matching.
Figure 3B:
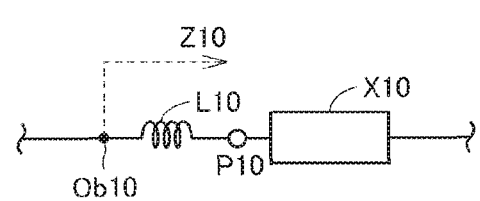
Figure 3C:
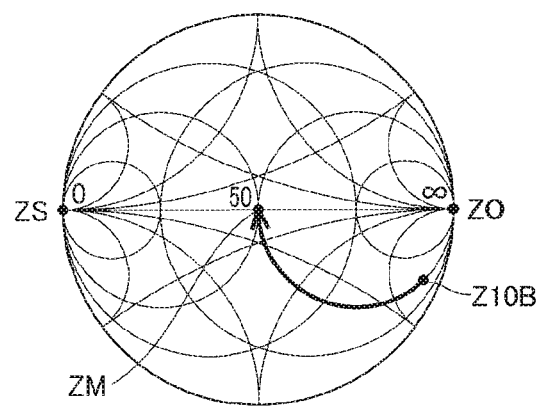

FIGS. 3A to 3C are diagrams depicting a change in impedance when an inductor is connected in series with a circuit element for impedance matching. FIG. 3A is a diagram illustrating part of a circuit including a circuit element X10. FIG. 3B is a diagram when impedance matching is performed by using an inductor L10. FIG. 3C is an immittance chart depicting a change in impedance. In FIG. 3C, a set of points having the same resistance component are represented as a constant-resistance circle (a circle in which a point ZO is inscribed) and a set of points having the same conductance component are represented as a constant-conductance circle (a circle in which a point ZS is inscribed). In FIG. 3C, the point ZS represents a short state (a state where the impedance is small enough to be treated as 0). The point ZO represents an open state (a state where the impedance is large enough to be treated as infinite). A point ZM is the center point of the immittance chart and represents a characteristic impedance (in FIG. 3C, 50Ω). The term "matching of the impedance" refers to moving the impedance, plotted on the immittance chart, toward the point ZM. This holds true for the immittance charts illustrated in FIGS. 4B, 5B, 6B, and 7B described below.

In the circuit illustrated in FIG. 3A, the circuit element X10 is connected to a terminal P10. An observation point Ob10 is a point that lies on a connection line extending through the terminal P10 and connected to the circuit element X10. The impedance of the terminal P10, as viewed from the observation point Ob10, is represented by an impedance Z10. Consideration is given to a case where the impedance Z10 at a particular frequency is capacitive (the imaginary part (reactance component) is negative) and the reactance component on the immittance chart illustrated in FIG. 3C can be represented by a point Z10B in a negative region. To move the impedance Z10 from the point Z10B toward the point ZM, as illustrated in FIG. 3B, an inductor L10 having an inductive impedance (the reactance component is positive) is connected between the observation point Ob10 and the circuit element X10 so as to be connected in series with the circuit element X10. As illustrated in FIG. 3C, the impedance Z10 is moved from the point Z10B along the constant-resistance circle in a direction in which the reactance component increases and is moved close to the point ZM.

Figure 4A:
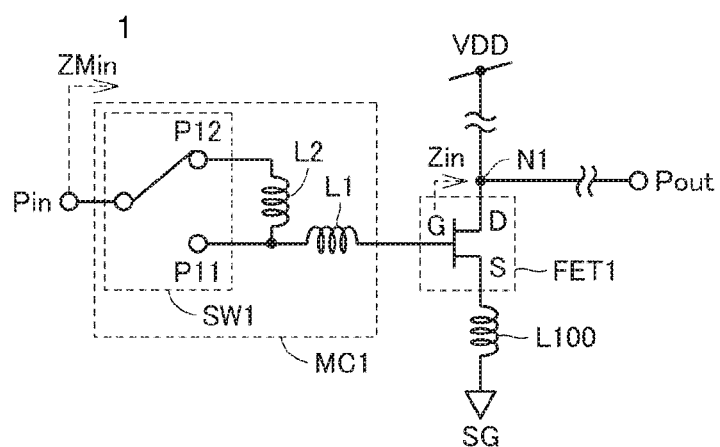
FIGS. 4A and 4B are diagrams depicting an operation of a first matching circuit in the low-noise amplifier illustrated in FIG. 1.
Figure 4B:
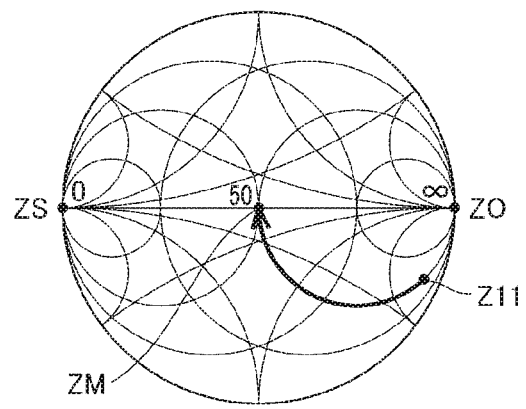
Figure 5A:
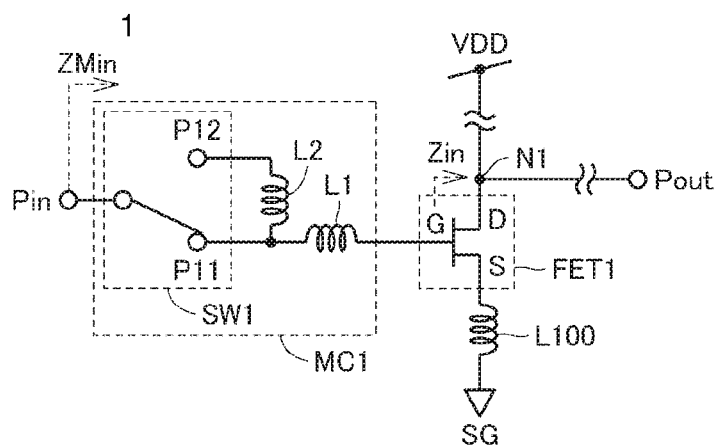
FIGS. 5A and 5B are diagrams depicting an operation of the first matching circuit in the low-noise amplifier illustrated in FIG. 1.

FIGS. 4A, 4B, 5A, and 5B are diagrams depicting an operation of the first matching circuit MC1 in the low-noise amplifier 1 illustrated in FIG. 1. In FIGS. 4A to 5B, none of the second matching circuits MC2 and MC3 is illustrated since FIGS. 4A to 5B are used to explain an operation of the first matching circuit MC1. In FIGS. 4A and 5A, an impedance Zin represents the impedance of the gate of the first transistor FET1, as viewed from the input terminal Pin. An impedance ZMin represents the input impedance. The impedance Zin can be regarded as the impedance to which the input impedance ZMin has been matched by the first matching circuit MC1. In FIGS. 4A to 5B, consideration is given to a case where the input impedance of the gate of the first transistor FET1 when none of the first inductor L1 and the second inductor L2 is connected is substantially the same and can be represented by a point Z11 on a 50-Ω constant-resistance circle on the immittance charts illustrated in FIGS. 4B and 5B.

Referring to FIG. 4B, to match the input impedance ZMin by using the first matching circuit MC1 so as to be moved from the point Z11 toward the point ZM, it is necessary to increase the reactance component of the input impedance ZMin. Accordingly, as illustrated in FIG. 4A, the input terminal Pin and the terminal P12 are brought into electrical continuity by using the first switch SW1 so that the first inductor L1 and the second inductor L2 are connected between the input terminal Pin and the gate of the first transistor FET1. As illustrated in FIG. 4B, the input impedance ZMin is moved from the point Z11 along the constant-resistance circle in the direction in which the reactance component increases and is moved close to the point ZM.

Figure 5B:
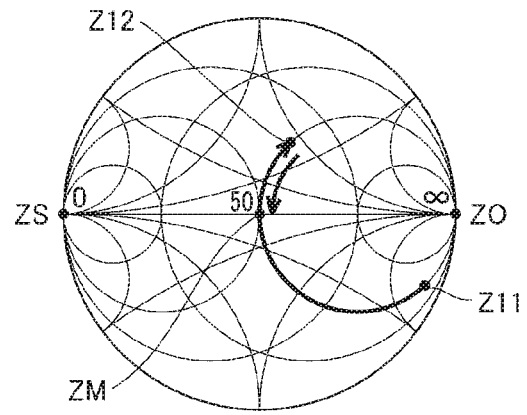

If the frequency of the input signal increases in the state illustrated in FIG. 4A, as illustrated in FIG. 5B, the input impedance ZMin may be moved through the point ZM and reach a point Z12. In this case, it is necessary to decrease the reactance component of the input impedance ZMin to return the input impedance ZMin from the point Z12 to the point ZM. Accordingly, as illustrated in FIG. 5A, the first switch SW1 is switched to bring the input terminal Pin and the terminal P11 into electrical continuity so that only the first inductor L1 is connected between the input terminal Pin and the gate of the first transistor FET1. As illustrated in FIG. 5B, the input impedance ZMin is moved from the point Z12 along the 50-Ω constant-resistance circle in the direction in which the reactance component decreases and is moved close to the point ZM.

In this way, by switching the first switch SW1, the first matching circuit MC1 can match the input impedance ZMin in accordance with the frequency of the input signal.

Figure 6A:
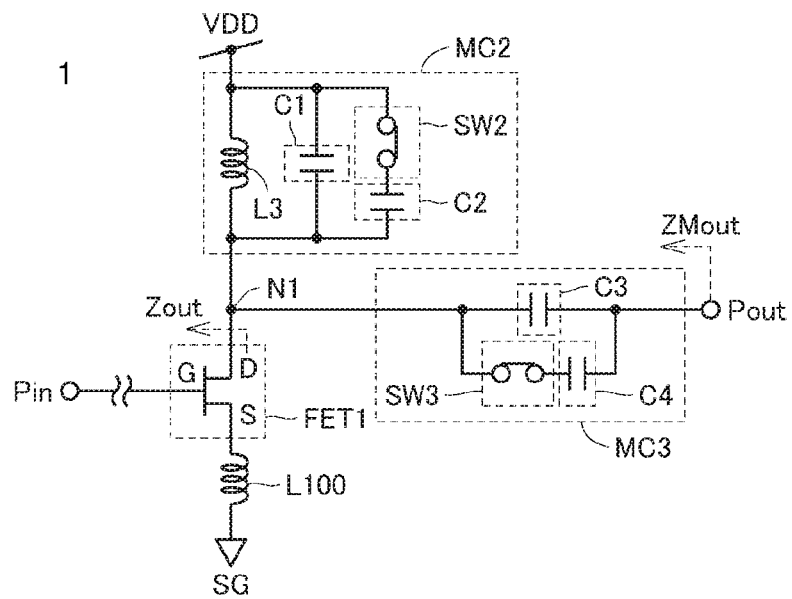
FIGS. 6A and 6B are diagrams depicting an operation of a second matching circuit and a third matching circuit in the low-noise amplifier illustrated in FIG. 1.

Next, a description will be given of the matching of the output impedance by using the second matching circuit MC2 and the third matching circuit MC3. FIGS. 6A, 6B, 7A, and 7B are diagrams depicting an operation of the second matching circuit MC2 and the third matching circuit MC3 in the low-noise amplifier 1 illustrated in FIG. 1. In FIGS. 6A to 7B, the first matching circuit MC1 is not illustrated since FIGS. 6A to 7B are used to explain an operation of the second matching circuit MC2 and the third matching circuit MC3. In FIGS. 6A and 7A, an impedance Zout represents the impedance of the drain of the first transistor FET1, as viewed from the output terminal Pout. An impedance ZMout represents the output impedance. The output impedance ZMout can be regarded as the impedance to which the impedance Zout has been matched by the second matching circuit MC2 and the third matching circuit MC3. In FIGS. 6A to 7B, consideration is given to a case where the impedance of the drain of the first transistor FET1 is substantially the same and can be represented by a point Z21 on the immittance charts illustrated in FIGS. 6B and 7B.

Figure 6B:
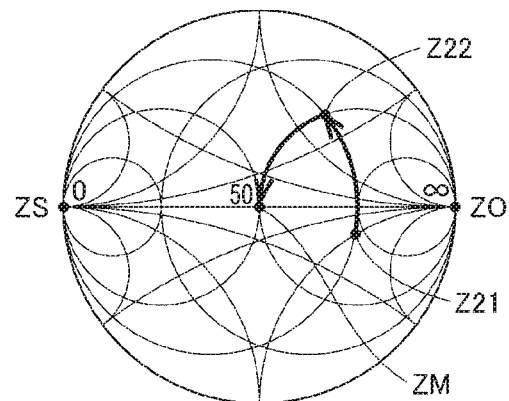
Figure 7A:
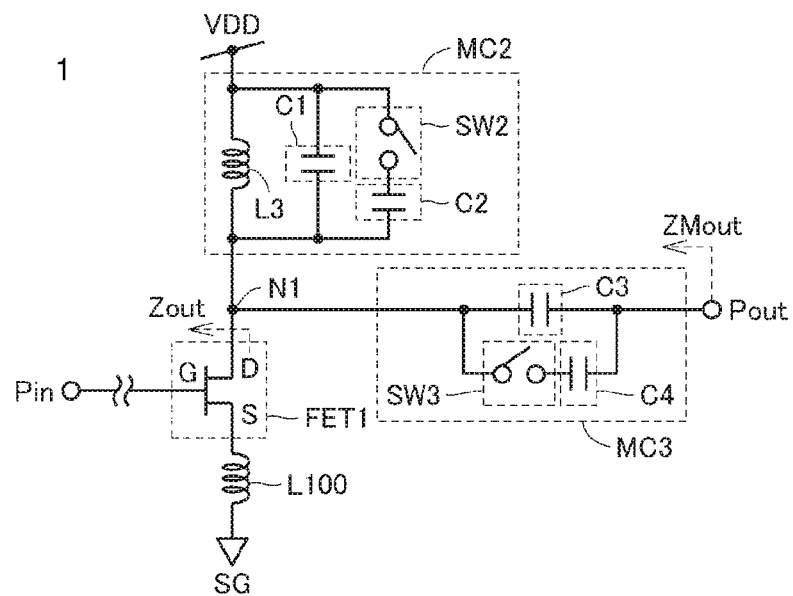
FIGS. 7A and 7B are diagrams depicting an operation of the second matching circuit and the third matching circuit in the low-noise amplifier illustrated in FIG. 1.

Referring to FIG. 6B, to match the impedance represented by the point Z21, the impedance is moved along the constant-conductance circle so as to become close to a point Z22 on a 50-Ω constant-resistance circle and then is moved from the point Z22 along the 50-Ω constant-resistance circle so as to be moved close to the point ZM. Thus, as illustrated in FIG. 6A, the second switch SW2 is brought into the closed position and the third switch SW3 is also brought into the closed position.

The reactance component $X_{mc2}$ of the second matching circuit MC2 can be expressed by Equation (1):

$$jX_{mc2} = j\frac{\omega_{in}L_{mc2}}{1 - \omega_{in}^2 L_{mc2} C_{mc2}} \quad (1)$$

where $\omega_{in}$ denotes the angular frequency of the input signal. When the frequency of the input signal is represented by $F_{in}$, $\omega_{in}=2\pi F_{in}$ holds. In Equation (1), $L_{mc2}$ denotes the inductance of the third inductor L3, and $C_{mc2}$ denotes the combined capacitance of the first capacitor C1 and the second capacitor C2 of the second matching circuit MC2. That is, when the second switch SW2 is in the closed position, $C_{mc2}$=C1+C2 holds, and when the second switch SW2 is in the open position, $C_{mc2}$=C1 holds. Here, "j" is the imaginary unit.

When the second switch SW2 is brought into the closed position, the capacitance $C_{mc2}$ in Equation (1) increases from C1 to C1+C2. Since the denominator of Equation (1) decreases, the reactance component $X_{mc2}$ of the second matching circuit MC2 increases (in other words, the susceptance component, which is the reciprocal of the reactance component, decreases). As a result, as illustrated in FIG. 6B, the output impedance ZMout can be moved from the point Z21 along the constant-conductance circle in the direction in which the reactance component increases and moved close to the point Z22 on the 50-Ω constant-resistance circle. Further, the third switch SW3 is brought into the closed position, thereby allowing the output impedance ZMout to be moved from the point Z22 along the 50-Ω constant-resistance circle in the direction in which the reactance component decreases and to be moved close to the point ZM.

Figure 7B:
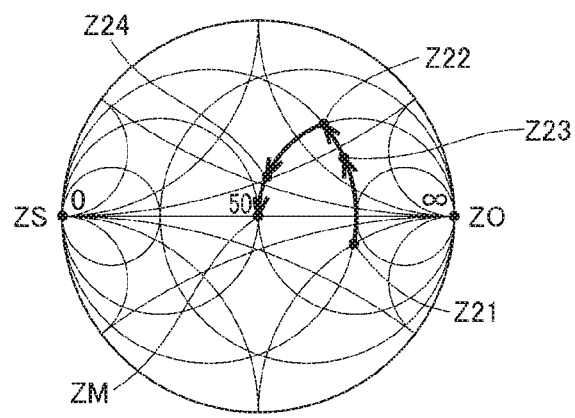

If the frequency of the input signal increases in the state illustrated in FIG. 6A, as given by Equation (1), the angular frequency $\omega_{in}$ increases and accordingly the reactance component increases in the impedance matching using the second matching circuit MC2, as illustrated in FIG. 7B. However, as the reactance increases, the susceptance, which is the reciprocal of the reactance, decreases, resulting in a decrease in the movement distance along the constant-conductance circle. Thus, at a high frequency, the output impedance ZMout is moved only to a point Z23 between the points Z21 and Z22 when the second switch SW2 is brought into the closed position. To move the output impedance ZMout to the predetermined impedance Z22, it is necessary to increase the susceptance component of the second matching circuit MC2. That is, it is necessary to decrease the reactance component $X_{mc2}$ of the second matching circuit MC2. Accordingly, the second switch SW2 is brought into the open position to decrease the combined capacitance $C_{mc2}$ from C1+C2 to C1 in order to reduce the reactance component $X_{mc2}$ of the second matching circuit MC2. Thus, the reactance component $X_{mc2}$ is reduced to increase the susceptance component, thereby enabling the movement distance along the constant-conductance circle to increase.

Furthermore, in impedance matching using the third matching circuit MC3, the output impedance ZMout may be moved only to a point Z24 between the points Z22 and ZM.

The reactance component $X_{mc3}$ of the third matching circuit MC3 can be expressed by Equation (2):

$$jX_{mc3} = -j\frac{1}{\omega_{in}C_{mc3}} \quad (2)$$

where $C_{mc3}$ denotes the combined capacitance of the third capacitor C3 and the fourth capacitor C4 of the third matching circuit MC3. That is, when the third switch SW3 is in the closed position, $C_{mc3}$=C3+C4 holds, and when the third switch SW3 is in the open position, $C_{mc3}$=C3 holds.

When the angular frequency $\omega_{in}$ increases in accordance with an increase in the frequency of the input signal, the denominator of Equation (2) increases, resulting in a decrease in the absolute value of the reactance component $X_{mc3}$ of the third matching circuit MC3. Thus, as the reactance component $X_{mc3}$ decreases, the amount of movement along a constant-resistance circle decreases. In this case, the output impedance ZMout is moved only from the point Z22 to the point Z24. To make the output impedance ZMout reach 50Ω, a larger amount of movement than the amount of movement from the point Z22 to the point Z24 is necessary. It is thus necessary to increase the reactance component $X_{mc3}$. In Equation (2), the combined capacitance $C_{mc3}$ is reduced by an amount corresponding to the increase in the angular frequency $\omega_{in}$. Accordingly, as illustrated in FIG. 7A, the third switch SW3 is brought into the open position to decrease the combined capacitance $C_{mc3}$ from C3+C4 to C3.

The second switch SW2 is brought into the open position to thereby enable the output impedance ZMout to be moved from the point Z23 along the constant-conductance circle in the direction in which the reactance component decreases so as to be moved close to the point Z22 on the 50-Ω constant-resistance circle, as illustrated in FIG. 7B. Further, the third switch SW3 is brought into the open position to thereby enable the output impedance ZMout to be moved from the point Z24 along the 50-Ω constant-resistance circle in the direction in which the reactance component increases so as to be moved close to the point ZM.

Accordingly, individual switching of the second switch SW2 of the second matching circuit MC2 and the third switch SW3 of the third matching circuit MC3 enables the matching of the output impedance in accordance with the frequency of the input signal. The second matching circuit MC2 serves to move an impedance represented by a point on a particular constant-resistance circle to a point on another constant-resistance circle. That is, the second matching circuit MC2 allows a change in the real part (resistance component) of the output impedance. In contrast, the third matching circuit MC3 serves to move an impedance represented by a point on a particular constant-resistance circle along the particular constant-resistance circle. That is, the third matching circuit MC3 allows a change in the imaginary part (reactance component) of the output impedance. A combination of the second matching circuit MC2 and the third matching circuit MC3 can move the output impedance ZMout toward the characteristic impedance (e.g., 50Ω).

Figure 8:
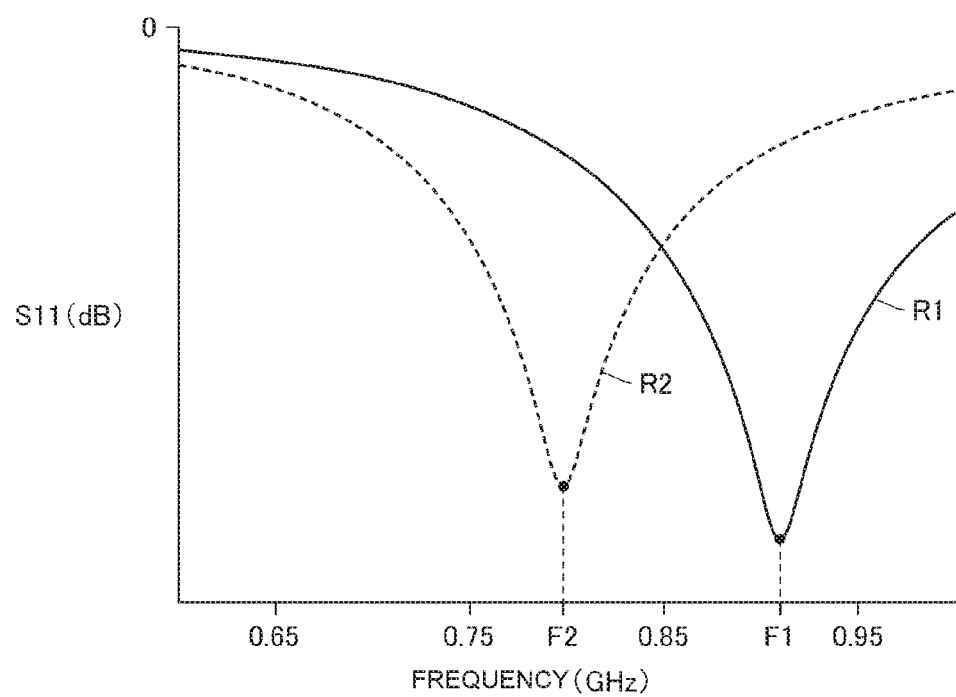
FIG. 8 is a diagram illustrating simulation results of the scattering parameter (S-parameter) S11 when a first switch is switched in the low-noise amplifier illustrated in FIG. 1.

FIG. 8 is a diagram illustrating simulation results of the scattering parameter (S-parameter) S11 when the first switch SW1 is switched in the low-noise amplifier 1 illustrated in FIG. 1. The S-parameter S11 represents how much of a signal input to the input terminal Pin is reflected and returned (reflection coefficient). When the impedance of the low-noise amplifier 1 has been matched to the characteristic impedance, the reflection coefficient attains a local minimum value. In FIG. 8, a curve R1 indicates a change in the S-parameter S11 when the input terminal Pin and the terminal P11 are brought into electrical continuity. A curve R2 indicates a change in the S-parameter S11 when the input terminal Pin and the terminal P12 are brought into electrical continuity.

As illustrated in FIG. 8, when the input terminal Pin and the terminal P11 are in electrical continuity, the S-parameter S11 attains a local minimum value at a frequency F1. That is, when the frequency of the input signal is about the frequency F1, the input terminal Pin and the terminal P11 are brought into electrical continuity to thereby enable the input impedance to be matched to the characteristic impedance. In this case, the inductance necessary for the matching of the input impedance is the inductance of the first inductor L1. When the input terminal Pin and the terminal P12 are in electrical continuity, the S-parameter S11 attains a local minimum value at a frequency F2 (<F1). That is, when the frequency of the input signal is about the frequency F2, the input terminal Pin and the terminal P12 are brought into electrical continuity to thereby enable the input impedance to be matched to the characteristic impedance. In this case, the inductance necessary for the matching of the input impedance is that of the sum of the inductance of the first inductor L1 and the inductance of the second inductor L2. In the low-noise amplifier 1, therefore, it is possible to achieve an input matching circuit with a wide bandwidth that is capable of selectively matching the input impedance when the frequency of the input signal is the frequency F1 and when the frequency of the input signal is the frequency F2.

Figure 9:
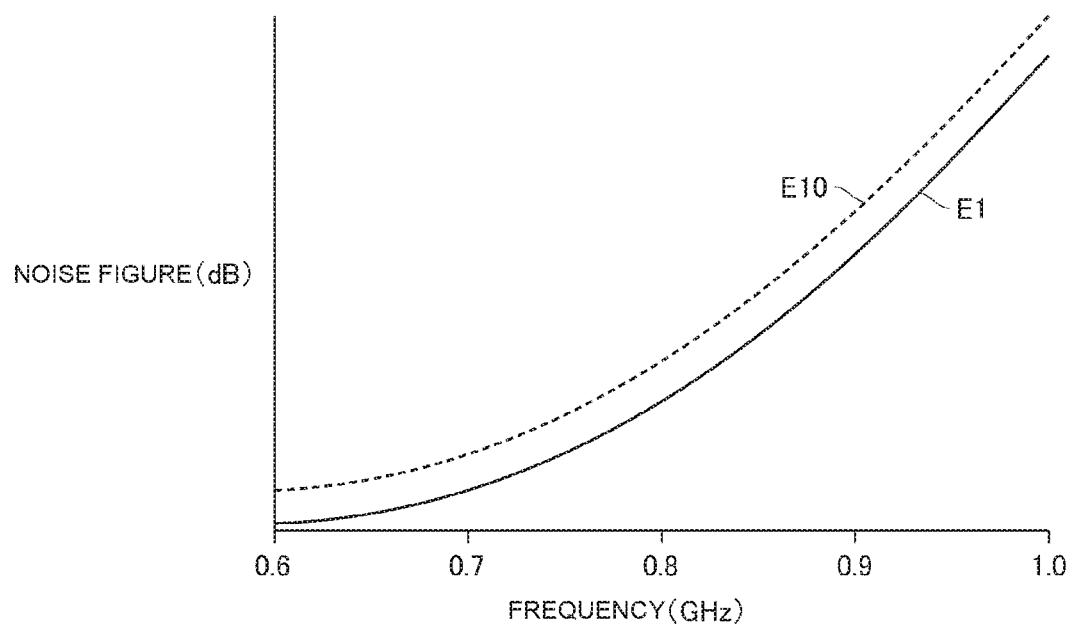
FIG. 9 is diagram illustrating simulation results of the noise figure at frequencies in both of the embodiment and the comparative example.

FIG. 9 is a diagram illustrating simulation results of the noise figure at frequencies in the embodiment and the comparative example. In FIG. 9, a curve E1 indicates a change in noise figure in the embodiment. A curve E10 indicates a change in noise figure in the comparative example. In both of the embodiment and the comparative example, the inductance necessary for the matching of the input impedance is assumed to be 37 nH. In the embodiment, consideration is given to a case where the input terminal Pin and the terminal P12 are connected to each other and the inductance (e.g., 27 nH) of the first inductor L1 and the inductance (e.g., 10 nH) of the second inductor L2 are used for the matching of the input impedance.

As illustrated in FIG. 9, the noise figure over a frequency band for which simulation was performed is lower in the embodiment than in the comparative example. In the embodiment, as described earlier, the first inductor L1 is shared and the inductance necessary for impedance matching is realized by the first inductor L1 and the second inductor L2. Thus, a wire (line) used to form an inductor can be made thicker than that in the comparative example to thereby reduce the resistance component of the inductor and reduce insertion loss. The noise figure can therefore be reduced.

According to the embodiment, therefore, it is possible to implement an input matching circuit with a wide bandwidth and reduced deterioration in noise figure. According to the embodiment, furthermore, it is possible for a second matching circuit and a third matching circuit to match the output impedance in accordance with the frequency of the input signal in response to a change in the output impedance of a first transistor that changes due to the switching of the effective inductance of a first matching circuit or in response to the impedance of a circuit connected to the output terminal. Therefore, it is possible to increase the bandwidth of a low-noise amplifier.

First Modification

In the embodiment, reference has been made to the case where a first matching circuit can perform two-stage matching of the input impedance. In the embodiment, further reference has been made to the case where each of a second matching circuit and a third matching circuit can perform two-stage matching of the output impedance. The first matching circuit may be capable of performing three or more stage matching of the input impedance. Each of the second matching circuit and the third matching circuit may be capable of performing three or more stage matching of the output impedance. In a first modification, the first matching circuit includes three inductors to make three-stage matching of the input impedance feasible, and each of the second matching circuit and the third matching circuit includes two switches so that the second matching circuit can perform four-stage switching and the third matching circuit can perform four-stage switching. Accordingly, the following description relates to a case where a combination of 4×4 stages makes 16-stage matching of the output impedance feasible.

The difference between the first modification and the embodiment is the configuration of a first matching circuit, a second matching circuit, and a third matching circuit. Other configurations are similar and are not described repeatedly.

Figure 10:
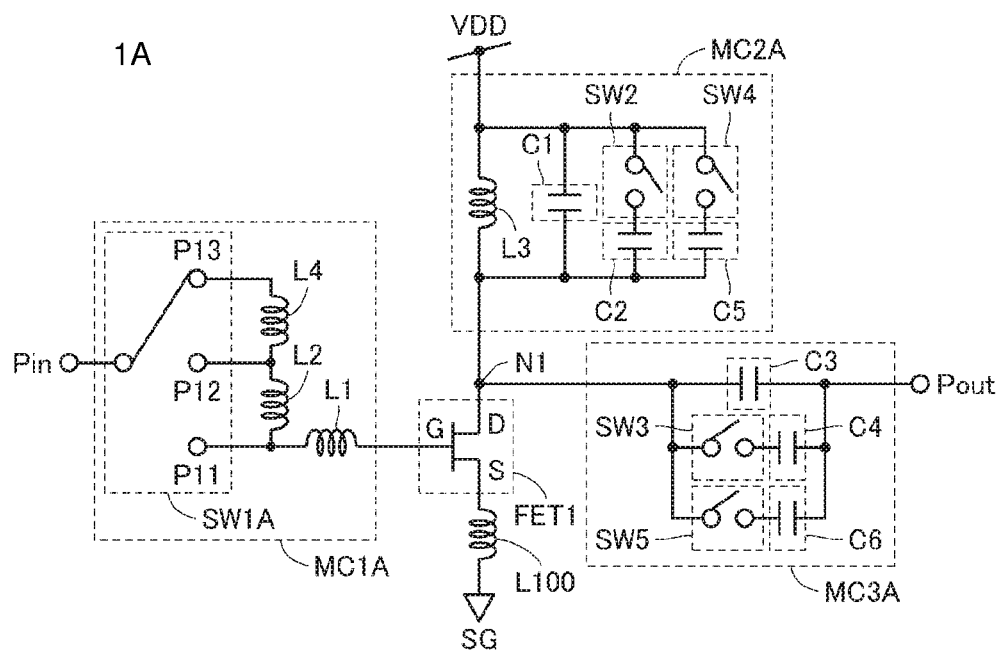
FIG. 10 is an exemplary circuit diagram of a low-noise amplifier according to a first modification of the embodiment.

FIG. 10 is an exemplary circuit diagram of a low-noise amplifier 1A according to the first modification of the embodiment. As illustrated in FIG. 10, the low-noise amplifier 1A includes a first matching circuit MC1A, a second matching circuit MC2A, and a third matching circuit MC3A.

The first matching circuit MC1A further includes a fourth inductor L4 in addition to the configuration of the first matching circuit MC1 illustrated in FIG. 1 and includes a first switch SW1A in place of the first switch SW1. One end of the fourth inductor L4 is connected to the other end of the second inductor L2. The first switch SW1A is configured to selectively switch among electrical continuity between the input terminal Pin and the other end of the first inductor L1, electrical continuity between the input terminal Pin and the other end of the second inductor L2, and electrical continuity between the input terminal Pin and the other end of the fourth inductor L4. The first matching circuit MC1A performs matching of the input impedance.

The second matching circuit MC2A further includes a fifth capacitor C5 and a fourth switch SW4 in addition to the configuration of the second matching circuit MC2 illustrated in FIG. 1. The fourth switch SW4 is connected in series with the fifth capacitor C5. The fifth capacitor C5 and the fourth switch SW4, which are connected in series, are connected in parallel with the first capacitor C1.

The third matching circuit MC3A further includes a sixth capacitor C6 and a fifth switch SW5 in addition to the configuration of the third matching circuit MC3 illustrated in FIG. 1. The fifth switch SW5 is connected in series with the sixth capacitor C6. The sixth capacitor C6 and the fifth switch SW5, which are connected in series, are connected in parallel with the third capacitor C3.

The second matching circuit MC2A and the third matching circuit MC3A perform matching of the output impedance.

Figure 11:
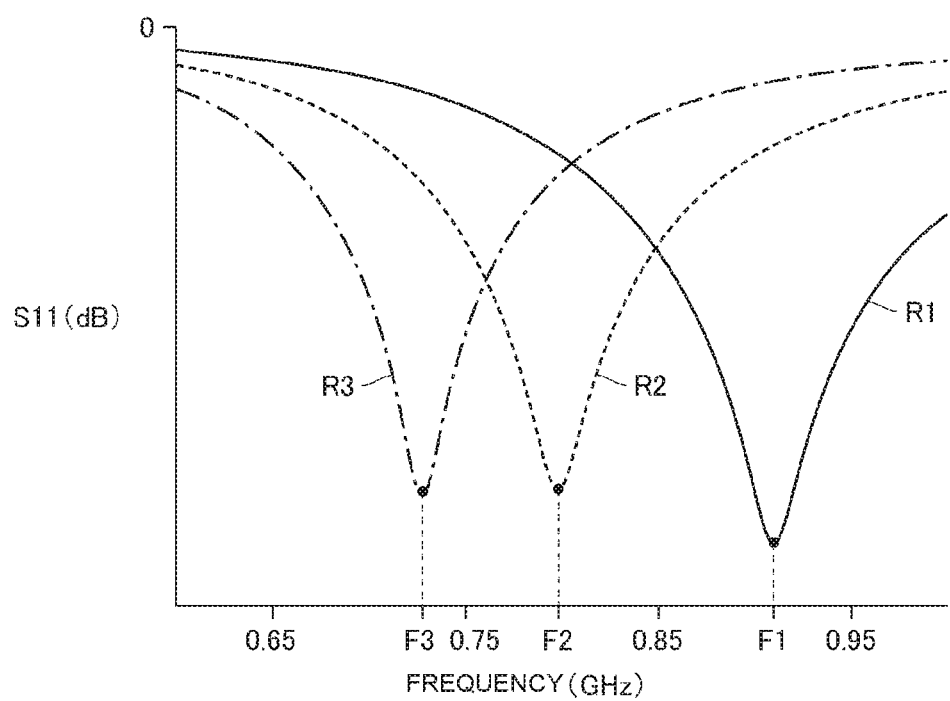
FIG. 11 is a diagram illustrating simulation results of the S-parameter S11 when a first switch is switched in the low-noise amplifier illustrated in FIG. 10.

FIG. 11 is a diagram illustrating simulation results of the S-parameter S11 when the first switch SW1A is switched in the low-noise amplifier 1A illustrated in FIG. 10. In FIG. 11, compared with FIG. 8, a curve R3 is further illustrated. The curve R3 indicates a change in the S-parameter S11 when the input terminal Pin and a terminal P13 of the first switch SW1A are brought into electrical continuity.

As illustrated in FIG. 11, when the input terminal Pin and the terminal P13 are in electrical continuity, the S-parameter S11 attains a local minimum value at a frequency F3 (<F2). That is, when the frequency of the input signal is about the frequency F3, the input terminal Pin and the terminal P13 are brought into electrical continuity to thereby enable the input impedance to be matched to the characteristic impedance. In this case, the inductance necessary for the matching of the input impedance is that of the sum of the inductance of the first inductor L1, the inductance of the second inductor L2, and the inductance of the fourth inductor L4. In the low-noise amplifier 1A, therefore, it is possible to match the input impedance when the frequency of the input signal is the frequency F1, when the frequency of the input signal is the frequency F2, and when the frequency of the input signal is the frequency F3, leading to a further increase in the bandwidth of an input matching circuit.

According to the first modification of the embodiment, therefore, it is possible to implement an input matching circuit with a wide bandwidth and reduced deterioration in noise figure. According to the first modification of the embodiment, furthermore, since three-stage matching of the input impedance is feasible, it is possible to further increase the bandwidth of the input matching circuit. According to the first modification of the embodiment, moreover, 16-stage matching of the output impedance is feasible, leading to a further increase in the bandwidth of a low-noise amplifier.

Second Modification

In the embodiment, an amplifier including one transistor has been described. Alternatively, an amplifier including more than one transistor may be used. In a second modification, two transistors are connected in cascode between the power supply and the ground point.

Figure 12:
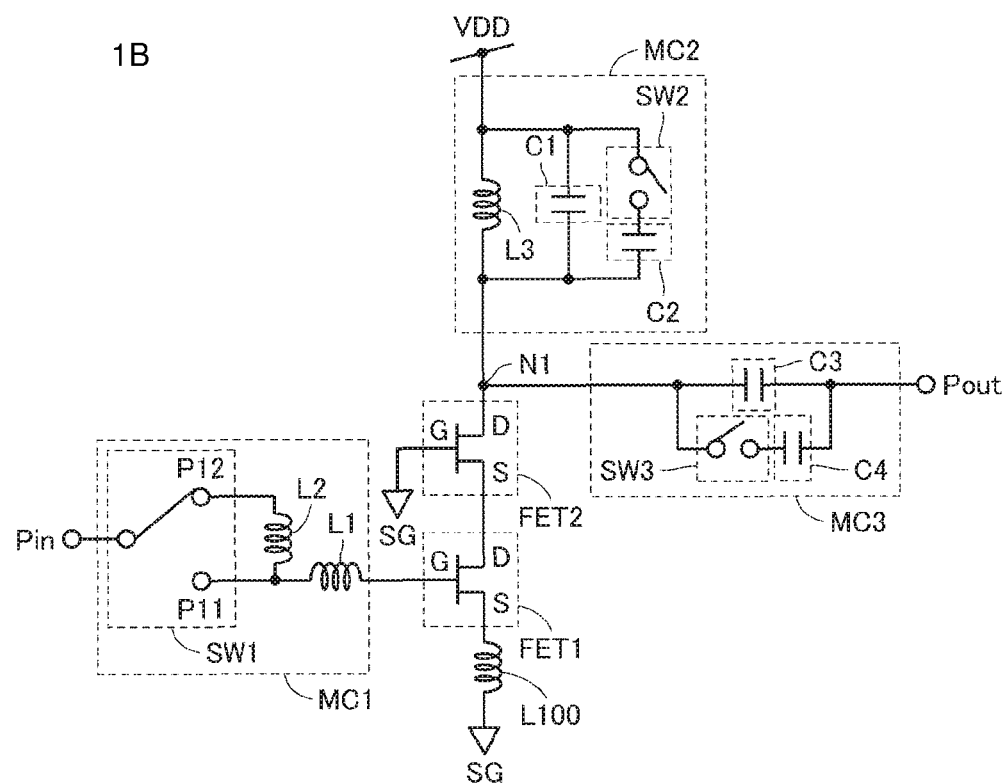
FIG. 12 is an exemplary circuit diagram of a low-noise amplifier according to a second modification of the embodiment.

FIG. 12 is an exemplary circuit diagram of a low-noise amplifier 1B according to a second modification of the embodiment. In FIG. 12, the elements illustrated in FIG. 1 are not described repeatedly. As illustrated in FIG. 12, the low-noise amplifier 1B further includes a second transistor FET2 in addition to the configuration illustrated in FIG. 1. The second transistor FET2 is a field effect transistor and includes a gate, a source, and a drain. The source of the second transistor FET2 is connected to the drain of the first transistor FET1. The drain of the second transistor FET2 is connected to the node N1. A bias adjustment circuit (not illustrated) is connected to the gate of the second transistor FET2.

According to the second modification of the embodiment, it is also possible to implement an input matching circuit with a wide bandwidth and reduced deterioration in noise figure. According to the second modification of the embodiment, furthermore, two transistors connected in cascode can achieve a higher amplification factor.

Third Modification

In the embodiment, reference has been made to the case where a transistor included in an amplifier is a field effect transistor. Alternatively, the amplifier may include a bipolar transistor. In a third modification, a description relates to a case where an amplifier includes a bipolar transistor. The difference between the third modification and the embodiment is that a transistor included in an amplifier is a bipolar transistor. Other configurations are similar and are not described repeatedly.

Figure 13:
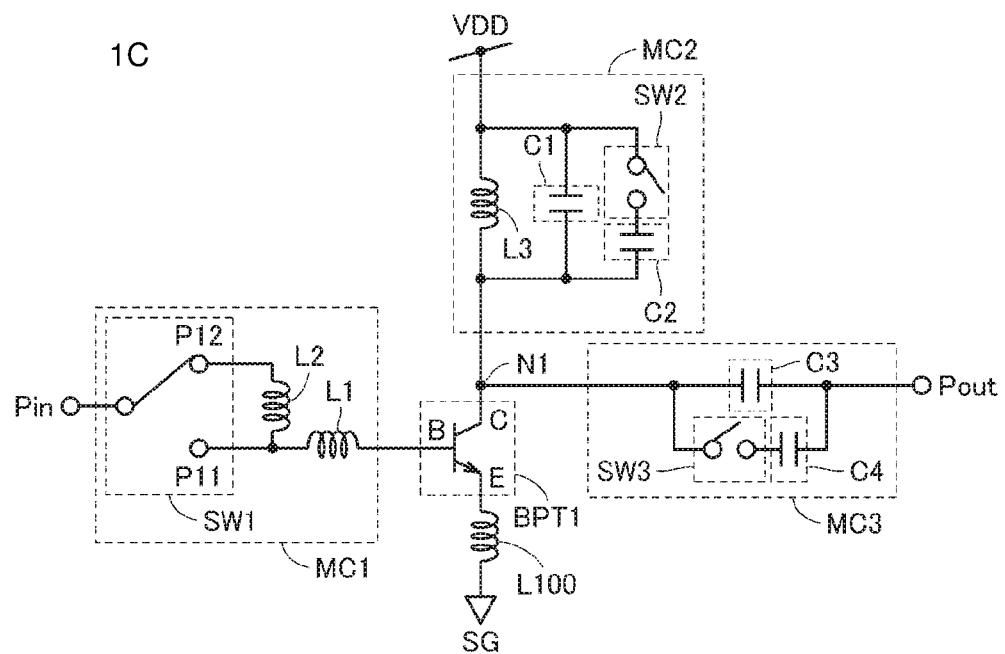
FIG. 13 is an exemplary circuit diagram of a low-noise amplifier according to a third modification of the embodiment.

FIG. 13 is an exemplary circuit diagram of a low-noise amplifier 1C according to the third modification of the embodiment. In FIG. 13, the elements illustrated in FIG. 1 are not described repeatedly. As illustrated in FIG. 13, the low-noise amplifier 1C includes a first transistor BPT1, which is a bipolar transistor, in place of the first transistor FET1 illustrated in FIG. 1. The first transistor BPT1 includes a base (B) that is a control terminal, an emitter (E) that is a first terminal, and a collector (C) that is a second terminal. The first matching circuit MC1 is connected between the input terminal Pin and the base of the first transistor BPT1. The emitter of the first transistor BPT1 is connected to the signal ground SG, which is a ground point. The collector of the first transistor BPT1 is connected to the power supply VDD and the output terminal Pout. A bias adjustment circuit (not illustrated) is connected to the base of the first transistor BPT1.

According to the third modification of the embodiment, it is also possible to implement an input matching circuit with a wide bandwidth and reduced deterioration in noise figure.

The embodiment and modifications disclosed herein may be combined as appropriate unless they are mutually exclusive. The embodiment disclosed herein is illustrative only and is not intended to be limiting in any way. The scope of the present invention is defined by the appended claims rather than the foregoing description, and it should be understood that all the changes conceived from the meaning and scope of the claims and their equivalents are included in the scope of the present invention.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An amplifier having an input terminal and an output terminal, for amplifying a signal input from the input terminal and outputting an amplified signal from the output terminal, comprising:
a first transistor including a control terminal, a first terminal, and a second terminal; and
a first matching circuit directly connected between the input terminal and the control terminal of the first transistor, wherein
the first terminal of the first transistor is connected to a ground,
the second terminal of the first transistor is connected to a power supply and the output terminal, and
the first matching circuit comprises:
a first inductor having a first end and a second end, the first end of the first inductor being connected to the control terminal,
a second inductor having a first end and a second end, the first end of the second inductor being connected to the second end of the first inductor, and
a first switch configured to selectively connect the input terminal to the second end of the first inductor or the second end of the second inductor.

2. The amplifier according to claim 1, further comprising:
a second matching circuit connected between the power supply and the second terminal of the first transistor; and
a third matching circuit connected between the output terminal and a node between the second terminal of the first transistor and the second matching circuit, wherein
the second matching circuit comprises:
a third inductor connected between the power supply and the second terminal of the first transistor,
a first capacitor connected in parallel with the third inductor,
a second capacitor, and
a second switch connected in series with the second capacitor, wherein the second capacitor and the second switch are connected in parallel with the first capacitor, and
the third matching circuit comprises:
a third capacitor connected between the node and the output terminal,
a fourth capacitor, and
a third switch connected in series with the fourth capacitor, wherein the fourth capacitor and the third switch are connected in parallel with the third capacitor.

3. The amplifier according to claim 2, further comprising:
a second transistor including a control terminal, a first terminal, and a second terminal, wherein
the first terminal of the second transistor is connected to the second terminal of the first transistor, and
the second terminal of the second transistor is connected to the node.

4. The amplifier according to claim 1, wherein
the first transistor is a field effect transistor,
the control terminal of the first transistor is a gate,
the first terminal of the first transistor is a source, and
the second terminal of the first transistor is a drain.

5. The amplifier according to claim 1, wherein
the first transistor is a bipolar transistor,
the control terminal of the first transistor is a base,
the first terminal of the first transistor is an emitter, and
the second terminal of the first transistor is a collector.

6. The amplifier according to claim 2, wherein the second matching circuit further comprises:
a fifth capacitor, and
a fourth switch connected in series with the fifth capacitor, wherein the fifth capacitor and the fourth switch are connected in parallel with the first capacitor.

7. The amplifier according to claim 2, wherein the third matching circuit further comprises:
a sixth capacitor, and
a fifth switch connected in series with the sixth capacitor, wherein the sixth capacitor and the fifth switch are connected in parallel with the third capacitor.

8. The amplifier according to claim 1, wherein the first matching circuit further comprises:

a fourth inductor having a first end and a second end, the first end of the fourth inductor being connected to the second end of the second inductor, wherein the first switch is configured to selectively connect the input terminal to the second end of the first inductor, the second end of the second inductor, or the second end of the fourth inductor.

\* \* \* \* \*